(12) United States Patent
Hong

(10) Patent No.: US 10,388,561 B2
(45) Date of Patent: Aug. 20, 2019

(54) SEMICONDUCTOR INTEGRATED CIRCUIT DEVICE HAVING ELECTROSTATIC DISCHARGE PROTECTION CIRCUIT

(71) Applicant: SK hynix Inc., Icheon-si Gyeonggi-do (KR)

(72) Inventor: Yun Seok Hong, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/613,780

(22) Filed: Jun. 5, 2017

(65) Prior Publication Data

US 2018/0025934 A1 Jan. 25, 2018

Related U.S. Application Data

(63) Continuation-in-part of application No. 15/363,627, filed on Nov. 29, 2016.

(30) Foreign Application Priority Data

Jul. 19, 2016 (KR) .................. 10-2016-0091117

(51) Int. Cl.
| | |
|---|---|
| *H05F 3/02* | (2006.01) |
| *H01L 21/71* | (2006.01) |
| *H01L 21/74* | (2006.01) |
| *H01L 27/02* | (2006.01) |
| *H01L 27/24* | (2006.01) |
| *H01L 45/00* | (2006.01) |

(52) U.S. Cl.
CPC .............. *H01L 21/71* (2013.01); *H01L 21/74* (2013.01); *H01L 27/0288* (2013.01); *H01L 27/2427* (2013.01); *H01L 45/141* (2013.01); *H05F 3/02* (2013.01)

(58) Field of Classification Search
CPC ............ H01L 27/0255; H01L 27/0266; H01L 27/0288; H01L 45/06; H01L 45/141
USPC .......................................... 257/4, 372, 546
See application file for complete search history.

(56) References Cited

U.S. PATENT DOCUMENTS

| | | |
|---|---|---|
| 5,838,146 A | 11/1998 | Singer |
| 2005/0135174 A1 | 6/2005 | Lee et al. |
| 2008/0080109 A1* | 4/2008 | Duch ..................... H02H 9/046 361/56 |
| 2009/0244796 A1* | 10/2009 | Tang ................... H01L 27/0251 361/56 |
| 2011/0210418 A1 | 9/2011 | Esmark |
| 2016/0013178 A1 | 1/2016 | Song |

* cited by examiner

*Primary Examiner* — Matthew E Warren
(74) *Attorney, Agent, or Firm* — William Park & Associates Ltd.

(57) ABSTRACT

A semiconductor integrated circuit device may include a first electrostatic discharge (ESD) protecting circuit and a second ESD protecting circuit. The first ESD protecting circuit may include at least one resistance changeable device connected between a power voltage line and a data pad to discharge an electrostatic. The second ESD protecting circuit may include at least one resistance changeable device connected between the first ESD protecting circuit and a ground voltage line.

7 Claims, 7 Drawing Sheets

SEMICONDUCTOR INTEGRATED CIRCUIT DEVICE HAVING ELECTROSTATIC DISCHARGE PROTECTION CIRCUIT

CROSS-REFERENCES TO RELATED APPLICATION

The application is a continuation-in-part of application Ser. No. 15/363,627, filed on Nov. 29, 2016, titled "SEMICONDUCTOR INTEGRATED CIRCUIT DEVICE RELATING TO AN ELECTRICAL OVER STRESS PROTECTING CIRCUIT," which is incorporated herein by reference in its entirety. A claim of priority under 35 U.S.C § 119 is made to Korean Patent Application No. 10-2016-0091117, filed on Jul. 19, 2016. The disclosure of the priority application is incorporated herein by reference in its entirety.

BACKGROUND

1. Technical Field

Various embodiments generally relate to a semiconductor integrated circuit device, and more particularly to a semiconductor integrated circuit device having an electrostatic discharge protection circuit.

2. Related Art

The growth in demand for mobile electronics is driving the development of semiconductor fabrication technologies. Semiconductor manufacturers are putting more elements than ever on a single chip. A system on a chip (SOC) is an integrated circuit that integrates two or more components of an electronic system into a single chip. For example, elements such as a memory, a processor, and a voltage control circuit may be integrated in a single chip. The SOC is frequently used in mobile electronics because of its small size and low power-consumption.

An electrostatic discharge (ESD) is an unwanted flow of electric current, which may be applied to the integrated circuit through input/output pads. The ESD can damage the integrated circuit. Therefore, there is a continuing need to develop a protection circuit for protecting the integrated circuit from the ESD.

SUMMARY

According to an embodiment, a semiconductor integrated circuit device may include a first electrostatic discharge (ESD) protecting circuit and a second ESD protecting circuit. The first ESD protecting circuit may include at least one resistance changeable device connected between a power voltage line and a data pad to discharge an electrostatic. The second ESD protecting circuit may include at least one resistance changeable device connected between the first ESD protecting circuit and a ground voltage line. Here, the resistance changeable device may be an ovonic threshold switch (OTS) device.

According to an embodiment, a semiconductor integrated circuit device may include a power voltage line, a ground voltage line, a first electrostatic discharge (ESD) protecting circuit, a second ESD protecting circuit, and a charge device model (CDM) discharge protecting circuit. The power voltage line may be connected to a power voltage pad. The ground voltage line may be connected to a ground voltage pad. The first ESD protecting circuit may be connected to a data pad and the power voltage line. The second ESD protecting circuit may be connected to the data pad, the first ESD protecting circuit, and the ground voltage line. The CDM discharge protecting circuit may be connected between connection nodes of the first and second ESD protecting circuits and an internal circuit. At least one of the first ESD protecting circuit, the second ESD protecting circuit, and the CDM discharge protecting circuit may include a resistance changeable device. Here, the resistance changeable device may be an ovonic threshold switch (OTS) device.

DETAILED DESCRIPTION

Figure 1:
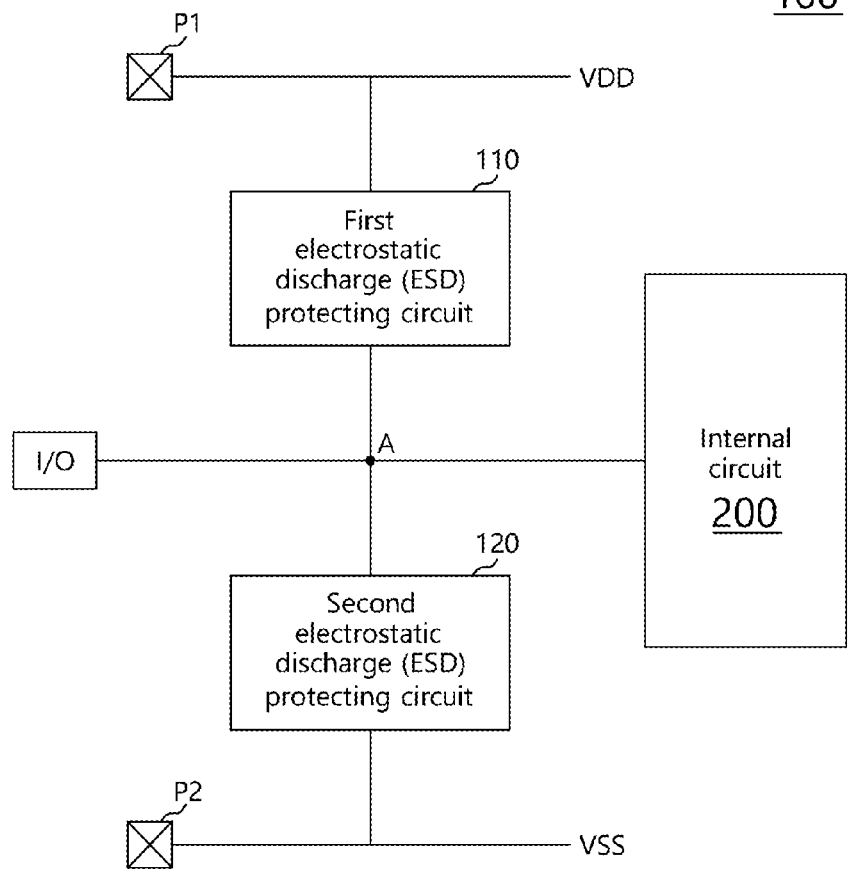
FIG. 1 is a diagram illustrating a semiconductor integrated circuit device having an ESD protection circuit in accordance with example embodiments.

Various example embodiments will be described hereinafter with reference to the accompanying drawings, in which some examples of the embodiments are illustrated. The embodiments may, however, be embodied in many different forms and should not be construed as limited to the examples of embodiments set forth herein. Rather, these examples of embodiments are provided so that this disclosure will be thorough and complete, and will fully convey a scope of the present disclosure to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present disclosure.

Spatially relative terms, such as "under," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "under" other elements or features would then be oriented "above" the other elements or features. Thus, the example of the term "below" can encompass both an orientation of above and below. The device may be otherwise oriented (rotated 90 degrees or at other orientations) and the spatially relative descriptors used herein interpreted accordingly.

The terminology used herein is for the purpose of describing particular examples of embodiments only and is not intended to be limiting of the present disclosure. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, examples of the embodiments will be explained with reference to the accompanying drawings.

FIG. 1 is a diagram illustrating a semiconductor integrated circuit device having an ESD protection circuit in accordance with example embodiments.

Referring to FIG. 1, a semiconductor integrated circuit device 100 may include a data pad I/O, a first ESD protecting circuit 110, a second ESD protecting circuit 120, and an internal circuit 200.

The data pad I/O may be an interface that is used to input data from an external device to the internal circuit 200 and/or output data from the internal circuit 200 to the external device.

The first ESD protecting circuit 110 and the second ESD protecting circuit 120 may be arranged between the data pad I/O and the internal circuit 200 to protect the internal circuit 200 from an ESD surge that may flows through the data pad I/O coupled to terminals of a power voltage and a ground voltage.

The first ESD protecting circuit 110 may be connected between the data pad I/O and a power voltage line VDD connected to a power voltage pad P1. The second ESD protecting circuit 120 may be connected between the first ESD protecting circuit 110 and a ground voltage line VSS connected to a ground voltage pad P2. In FIG. 1, a node A may be a connection node that connects the data pad I/O, the first ESD protecting circuit 110, and the second ESD protecting circuit 120 to each other.

Figure 2:
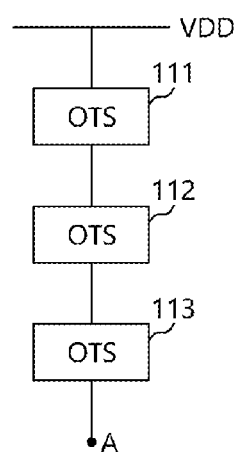
FIG. 2 is a diagram illustrating an example of a first ESD protecting circuit in FIG. 1.

The first ESD protecting circuit 110 may include at least one resistance changeable device. Here, it is assumed that the resistance changeable device is an ovonic threshold switch (OTS) device. Referring to FIG. 2, a first ESD protecting circuit 110a may include a plurality of OTS devices 111, 112, and 113 connected between the power voltage line VDD and the node A in series.

Figure 3:
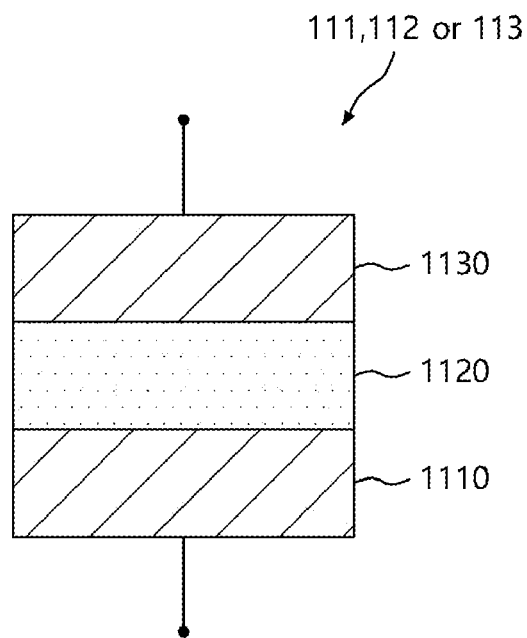
FIG. 3 is a cross-sectional view illustrating an OTS circuit in accordance with example embodiments.

Referring to FIG. 3, each OTS device 111, 112 or 113 may include a lower electrode 1110, a resistance changeable layer 1120, and an upper electrode 1130. The resistance changeable layer 1120 may include a chalcogenide. Here, it is assumed that the resistance changeable layer 1120 is a chalcogenide layer 1120. The chalcogenide layer 1120 may be formed on the lower electrode 1110. The upper electrode 1130 may be formed on the chalcogenide layer 1120. Here, characteristics of the chalcogenide may be used in turning on/off the OST device 111, 112 and/or 113. When a voltage that is greater than or equal to a threshold voltage of the chalcogenide layer 1120 or a current that is greater than or equal to a threshold current of the chalcogenide layer 1120 is applied to the upper electrode 1130 or the lower electrode 1110, the chalcogenide layer 1120 may change its resistive state from a high-resistance state and a conductive state. Here, the OTS device 111, 112 or 113 may provide a rapid switching characteristic.

The chalcogenide layer 1120 may include a chalcogenide element and at least one chemical or modifying element. For example, the chalcogenide layer 1120 may include an element from a group consisting of Tellurium (Te), Selenium (Se), and Sulfur (S). The modifying element may include an element from a group consisting of Gallium (Ga), Aluminium (Al), and Indium (In) or an element from a group consisting of Phosphorus (P), Arsenic (As) or Antimony (Sb). A resistance of the chalcogenide layer 1120 may vary depending on a composition ratio of the above-mentioned elements and a thickness of the chalcogenide layer 1120.

In example embodiments where the first ESD protecting circuit 110 includes the serially connected OTS devices 111, 112 and 113, and the upper electrode 1130 of the first OTS device 111 may be connected to the power voltage line VDD, and the lower electrode 1110 of the first OTS device 111 may be connected to the upper electrode 1130 of the second OTS device 112.

Figure 4:
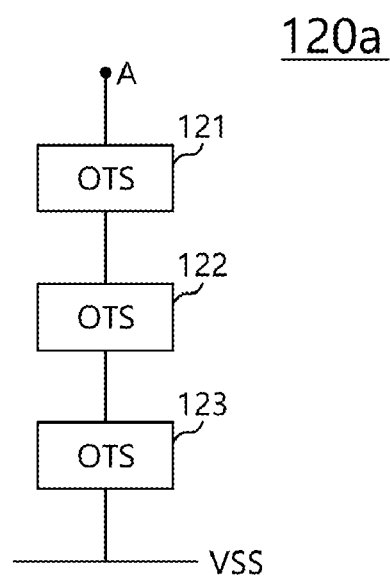
FIG. 4 is a diagram illustrating an example of a second ESD protecting circuit in FIG. 1.

The second ESD protecting circuit 120 may include at least one OTS device. Referring to FIG. 4, a second ESD protecting circuit 120a may include a plurality of the OTS devices 121, 122, and 123 connected between the node A and the ground voltage line VSS in series. The OTS devices 121, 122, and 123 in the second ESD protecting circuit 120a may have configurations the same or substantially the same as those of the OTS devices 111, 112 and 113 in the first ESD protecting circuit 110a.

When positive electrostatic charges are drained from the data pad I/O to the first and second ESD protecting circuits 110a and 120a, the OTS devices 111, 112 and 113 of the first ESD protecting circuit 110a may discharge the electrostatic charges through the power voltage line VDD and the power voltage pad P1.

When negative electrostatic charges are drained from the ground voltage pad P2 to the first and second ESD protecting circuits 110a and 120a, the OTS devices 121, 122 and 123 of the second ESD protecting circuit 120a may discharge the electrostatic charges to the data pad I/O.

Figure 5:
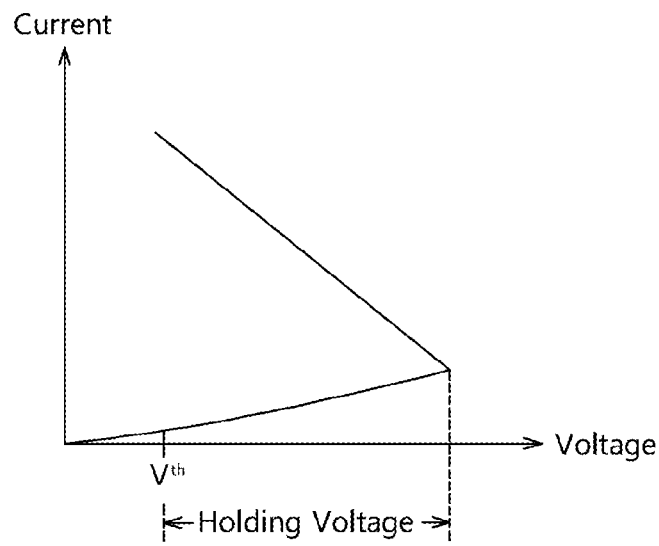
FIG. 5 is a graph showing current-voltage characteristics of an OTS device in accordance with example embodiments.

Referring to FIG. 5, the OTS devices 111, 112, 113, 121, 122, and 123 may snap back if a voltage applied thereto exceeds a certain voltage level. That is, "off" state (non-conductive state) of the OTS devices 111, 112, 113, 121, 122 and 123 may be maintained when a voltage applied thereto is lower than the threshold voltage Vth. The OTS devices 111, 112, 113, 121, 122, and 123 may snap back to "on" state (conductive state) when the voltage applied thereto is higher than the threshold voltage Vth. That is, the OTS devices 111, 112, 113, 121, 122, and 123 may be maintained at the "on" state if the voltage applied thereto is maintained within holding voltage levels Holding Voltage. Thus, the electrostatic charges in the power voltage line VDD and/or the ground voltage line VSS may be effectively discharged.

Figure 6:
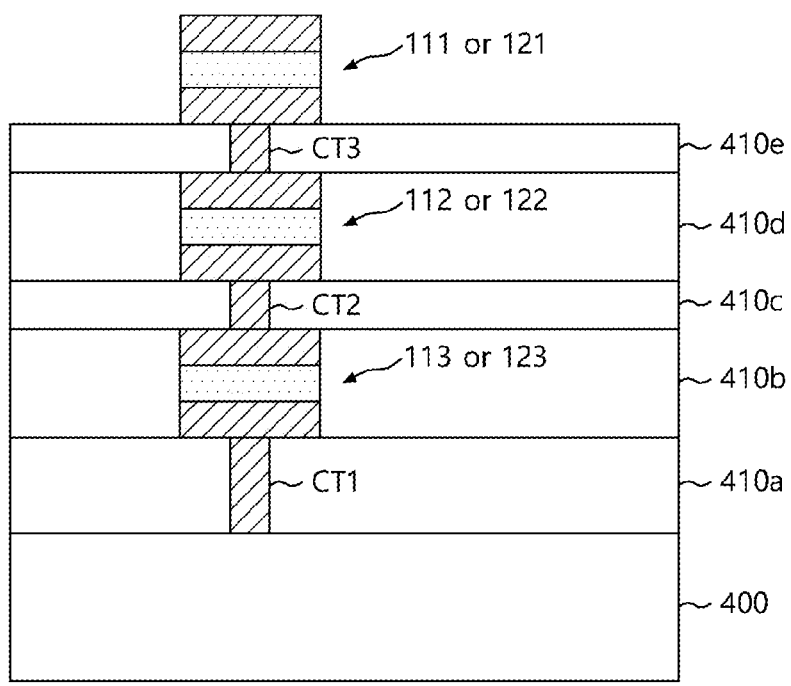
FIG. 6 is a cross-sectional view illustrating OTS devices on a semiconductor substrate in accordance with example embodiments.

Unlike a diode arranged in a junction region of a semiconductor substrate, the OTS devices 111, 112, 113, 121, 122, and 123 may be arranged on an insulating layer. In FIG. 6, the serially connected OTS devices 111, 112, 113, 121, 122, and 123 may be stacked and coupled to each other through formed contacts CT1, CT2, and CT3, and thus the OTS devices 111, 112, 113, 121, 122 and 123 may not lead to an increase in an area of the ESD protection circuit. In FIG. 6, a reference numeral 400 may represent a semiconductor substrate, and reference numerals 410a, 410b, 410c, 410d, and 410e may represent insulating interlayers.

Because the OTS devices 111, 112, 113, 121, 122, and 123 may be arranged on an insulating layer, the OTS devices 111, 112, 113, 121, 122, and 123 may be formed without a junction capacitor having a high capacitance. Further, by using the insulating interlayers 410a, 410b, 410c, 410d and 410e with a low dielectric constant, the capacitance may be reduced. Thus, signal transmission characteristics may be improved by reducing a parasitic capacitance of the ESD protection circuit.

Figure 7:
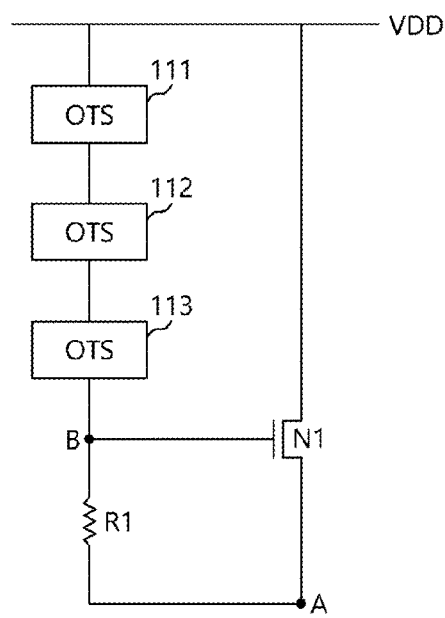
FIG. 7 is a diagram illustrating a first ESD protecting circuit in accordance with example embodiments.

Referring to FIG. 7, the first ESD protecting circuit 110a may include the OTS devices 111, 112, and 113, a resistor R1, and an NMOS transistor N1. The OTS devices 111, 112 and 113 may be connected between the power voltage line VDD and the resistor R1. The resistor R1 may be connected between an output node B of the OTS devices 111, 112, and 113 and the node A. The node A may be connected to the data pad I/O. The NMOS transistor N1 may connect the power voltage line VDD to the node A in response to a voltage from the output node B of the OTS devices 111, 112, and 113.

Figure 8:
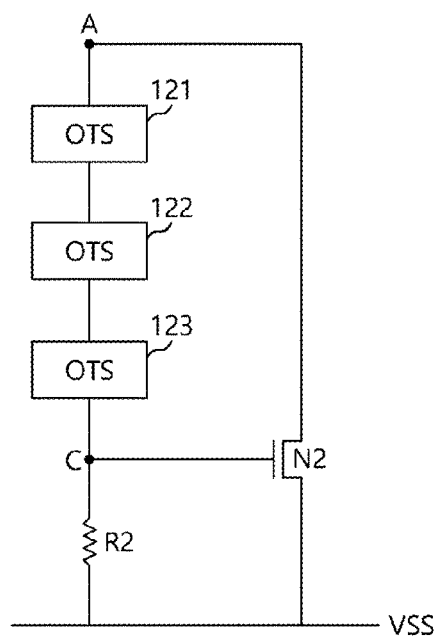
FIG. 8 is a diagram illustrating a second ESD protecting circuit in accordance with example embodiments.

Referring to FIG. 8, the second ESD protecting circuit 120a may include the OTS devices 121, 122, and 123, a resistor R2, and an NMOS transistor N2. The OTS devices 121, 122, and 123 may be connected between the node A and the resistor R2. The resistor R2 may be connected between an output node C of the OTS devices 111, 112, and 113 and the ground voltage line VSS. The NMOS transistor N2 may connect the ground voltage line VSS to the node A in response to a voltage from the output node C of the OTS devices 121, 122 and 123.

When the positive electrostatic charges flow into the semiconductor integrated circuit device, the OTS devices 111, 112, and 113 and the NMOS transistor N1 may discharge the positive electrostatic charges through the power voltage line VDD and the power voltage pad P1.

When the negative electrostatic charges flow through the data pad I/O, the OTS devices 121, 122, and 123 and the NMOS transistor N2 may discharge the negative electrostatic charges through the ground voltage line VSS and the ground voltage pad P2.

Figure 9:
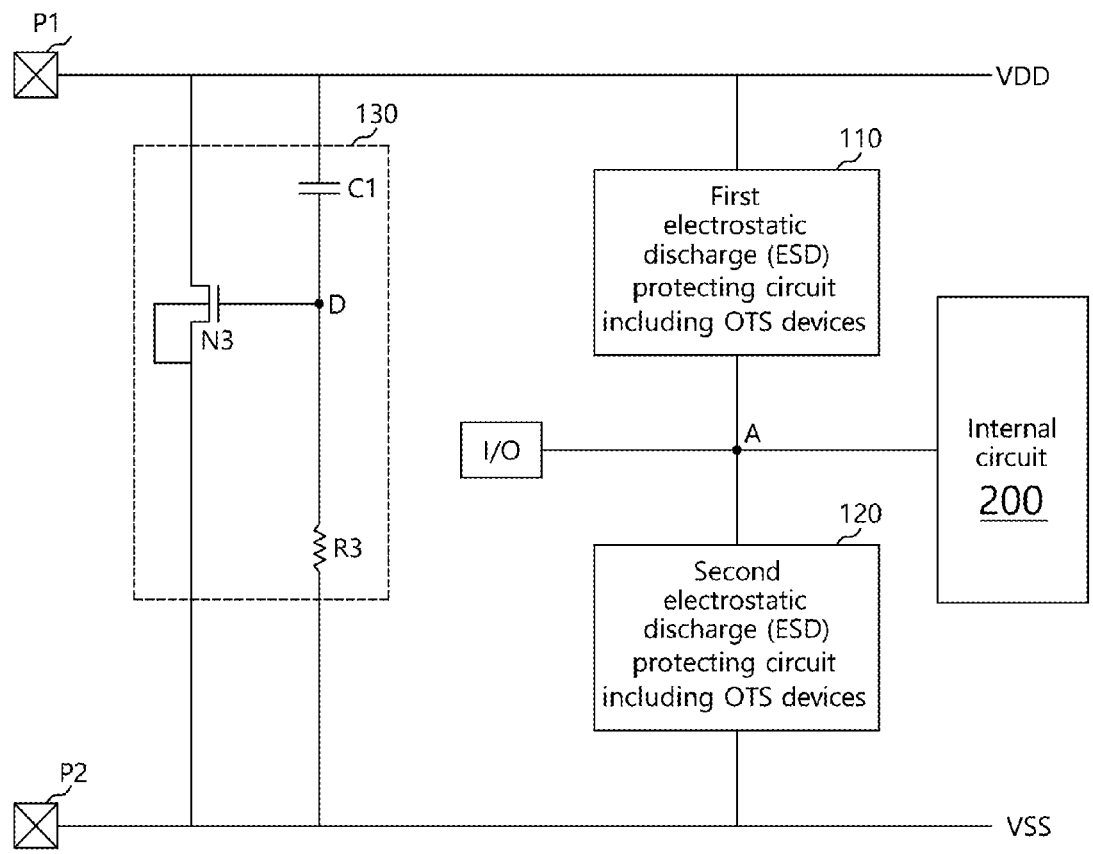
FIG. 9 is a diagram illustrating a semiconductor integrated circuit device having an ESD protection circuit in accordance with example embodiments.

Referring to FIG. 9, a clamping circuit 130 may be connected between the power voltage line VDD and the ground voltage line VSS. The clamping circuit 130 may include a capacitor C1, a resistor R3, and an NMOS transistor N3. The capacitor C1 may be connected between the power voltage line VDD and the resistor R3. The resistor R3 may be connected between the capacitor C1 and the ground voltage line VSS. The NMOS transistor N3 may form a discharge path between the power voltage line VDD and the ground voltage line VSS in response to a voltage at a connection node D between the capacitor C1 and the resistor R3.

For example, when the negative electrostatic charges flow through the power voltage pad P1, a voltage level of the connection node D may be increased, and thus the NMOS transistor N3 of the clamping circuit 130 may be turned-on. The negative electrostatic charges from the power voltage pad P1 may flow to the ground voltage line VSS through the NMOS transistor N3. The negative electrostatic in the ground voltage line VSS may be discharged to the data pad I/O through the second ESD protecting circuit 120 including the OTS device.

When the positive electrostatic charges flow through the data pad I/O, the OTS devices 111, 112 and 113 of the first ESD protecting circuit 110 may be driven to drop a voltage induced by the positive electrostatic charges. The positive electrostatic charges at the power voltage line VSS may increase a voltage level at the connection node D. Thus, the NMOS transistor N3 of the clamping circuit 130 may be turned-on so that the positive electrostatic charges may be discharged through the ground voltage line VSS and the ground voltage pad P2.

Figure 10:
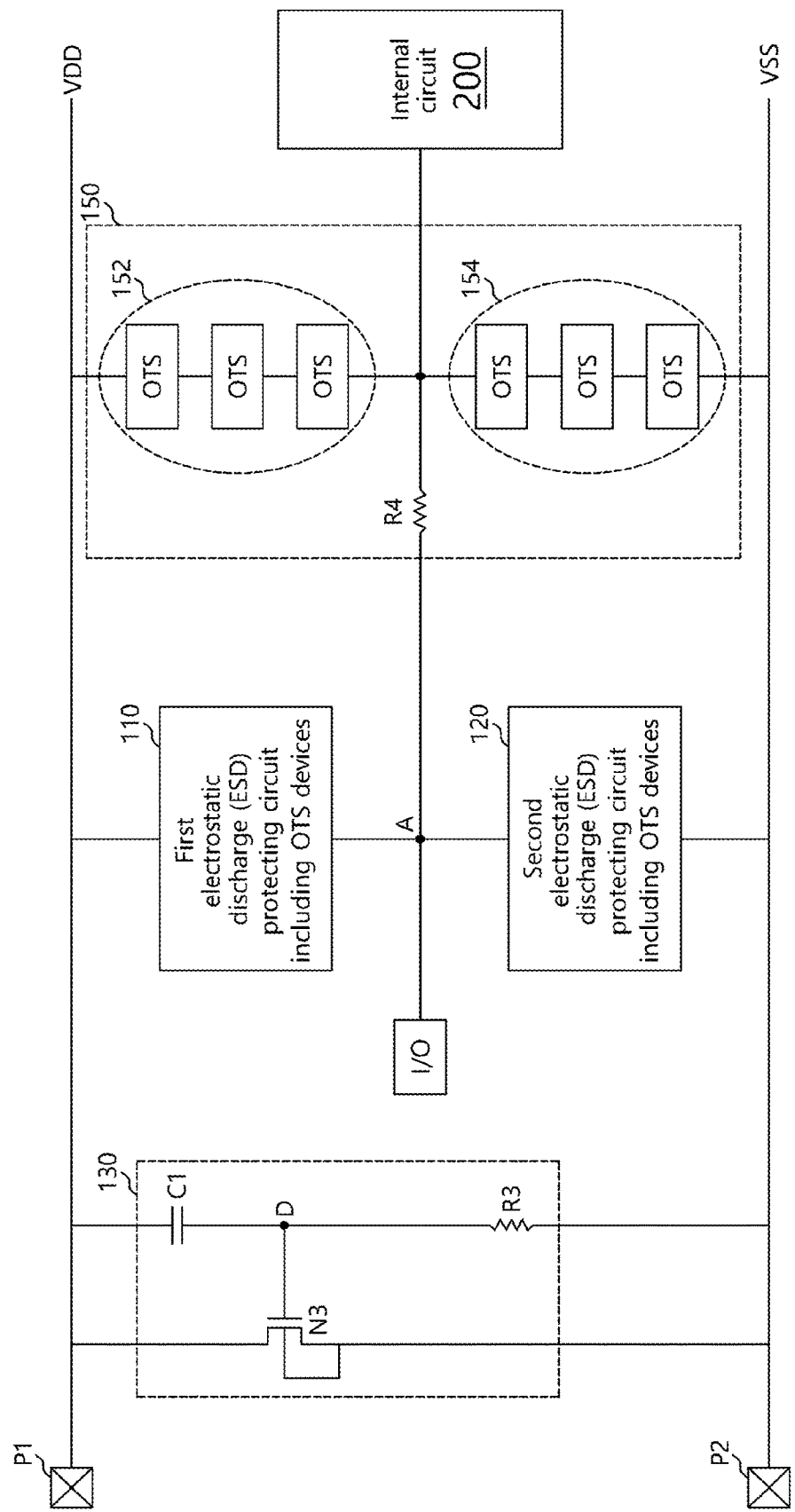
FIG. 10 is a diagram illustrating a semiconductor integrated circuit device having an ESD protection circuit in accordance with example embodiments.

Referring to FIG. 10, a charge device model (CDM) discharge protecting circuit 150 may be connected between the data pad I/O and the internal circuit 200.

The CDM discharge protecting circuit 150 may be an ESD protection circuit that is made by characterizing the susceptibility of an electronic device to damage from the electrostatic charges. A CDM test may include charging a package with a reference voltage, and discharging the reference voltage through a package lead. A discharge current may be defined by a parasitic impedance and a capacitance of the electronic device. Therefore, the CMD discharge current may find a plurality of paths connected to the package lead. Further, in order to rapidly discharge the CDM discharge current, the paths may have low impedance.

The CDM discharge protecting circuit 150 may include a CDM resistor R4, a first CDM discharge protecting circuit 152, and a second CDM discharge protecting circuit 154. The CDM resistor R4 may be positioned between the node A and the internal circuit 200. The first CDM discharge protecting circuit 152 may be connected between the power voltage line VDD and the second CDM discharge protecting circuit 154. The second CDM discharge protecting circuit 154 may be connected between the first CDM discharge protecting circuit 152 and the ground voltage line VSS. The first and second CDM discharge protecting circuits 152 and 154 may include at least one OTS device. The OTS device may quickly provide a current transmission path by a rapid switching characteristic to rapidly discharge CDM electrostatic charges.

According to example embodiments, the ESD protection circuit may include at least one OTS device. The ESD protection circuit may be formed by stacking a plurality of the OTS devices on the semiconductor substrate, and thus the junction capacitance may be reduced and area efficiency may be improved. Further, the OTS device may provide the discharge path through which the electrostatic charges may be rapidly discharged by the rapid switching characteristic and the holding voltage characteristic.

Figure 11:
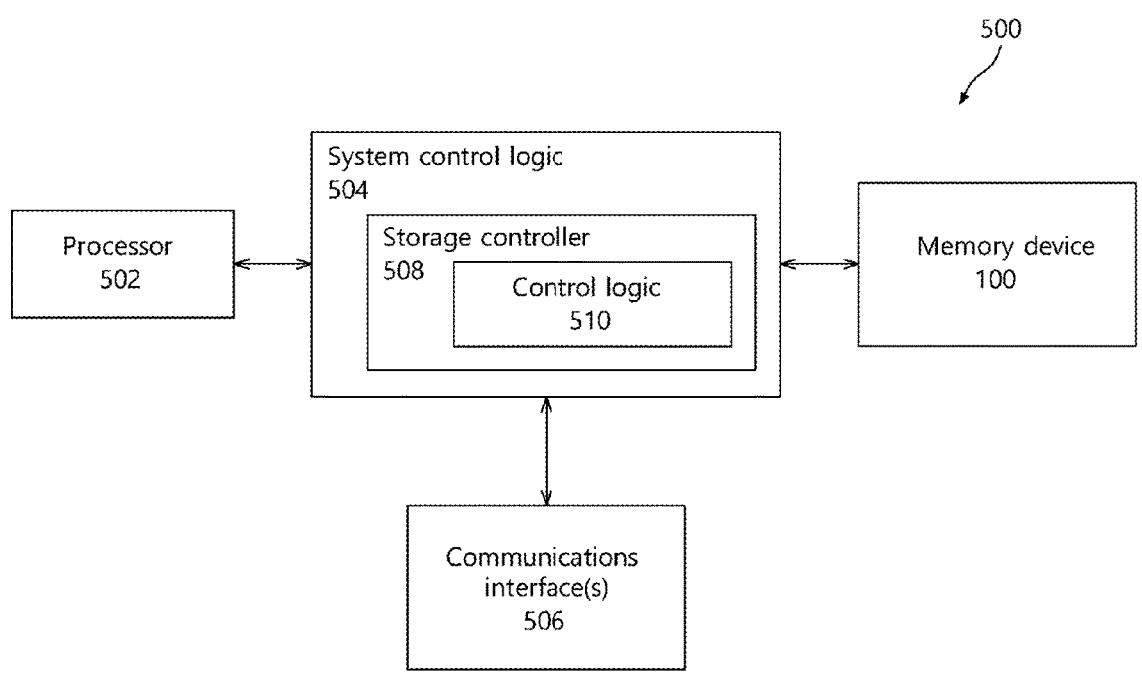
FIG. 11 is a diagram illustrating a system in accordance with example embodiments.

FIG. 11 is a diagram illustrating a system in accordance with example embodiments.

Referring to FIG. 11, a system 500 may include a system control logic 504, the semiconductor integrated circuit device 100, and at least one communication interface 506. The system control logic 504 may be connected to at least one of processors 502. The semiconductor integrated circuit device 100 may be connected to the system control logic 504. The communication interface 506 may be connected to the system control logic 504.

The communication interface 506 may provide an interface so that the system 500 may be communicated with devices through at least one network. The communication interface 506 may include a hardware and/or a firmware. In example embodiments, the communication interface 506 may include a network adaptor, a wireless network adaptor, a telephone modem, and/or a wireless modem. The communication interface 506 may use at least one antenna for a wireless communication.

At least one of the processors 502 may be packaged together with a logic for at least one controller of the system control logic 504. In example embodiments, the processor 502 may be packaged together with the logic for the controller of the system control logic 504 to form a system in package (SIP).

In example embodiments, at least one of the processors 502 may be arranged on a die in which the logic for the controller of the system control logic is installed.

In example embodiments, at least one of the processors 502 may be arranged on the die in which the logic for the controller of the system control logic is installed to form a system on chip (SOC).

In example embodiments, the system control logic 504 may include interface controllers that provide a device or a component communicating with at least one of the processors 502 and/or the system control logic 504 with interfaces.

In example embodiments, the system control logic 504 may include a storage controller 508 which provides the semiconductor integrated circuit device 100 with interfaces for controlling various access operations such as a set operation, a reset operation, a read operation, etc. The storage controller 508 may include a control logic 510 which controls the semiconductor integrated circuit device 100. The control logic 510 may additionally generate various selection signals for controlling drivers, level shifters, global selectors, etc. When the control logic 510 may be operated by at least one of the processors 502, the control logic 510 may include commands stored in a computer readable medium for performing the above-mentioned operations of the storage controller 508.

In example embodiments, the system 500 may include a desktop computing device, laptop computing device, a mobile computing device such as a smart phone, a tablet, etc. The system 500 may further include components and/or different architectures.

The above embodiments of the present disclosure are illustrative and not limitative. Various alternatives and equivalents are possible. The examples of the embodiments are not limited by the embodiments described herein. Nor is the present disclosure limited to any specific type of semiconductor device. Other additions, subtractions, or modifications are obvious in view of the present disclosure and are intended to fall within the scope of the appended claims.

What is claimed is:

1. A semiconductor integrated circuit device comprising:
  a first electrostatic discharge (ESD) protecting circuit including first to nth ovonic threshold switch (OTS) devices connected between a power voltage line and a data pad to discharge electrostatic charges in series, wherein the first OTS switch device is electrically coupled to the power voltage line and the nth OTS switch device is electrically coupled to the data pad, wherein "n" is an integer of 2 and more; and
  a second ESD protecting circuit including first to mth OTS devices connected between the first ESD protecting circuit and a ground voltage line in series, wherein "m" is an integer of 2 and more,
  wherein the first to nth OTS devices of the first ESD protecting circuit are sequentially stacked on a semiconductor substrate and the first to nth OTS devices of the first ESD protecting circuit are electrically coupled with each other via contacts.

2. The semiconductor integrated circuit device of claim 1, wherein each of the first to nth OTS devices of the first ESD protecting circuit comprises:
  a first electrode;
  a chalcogenide layer formed on the first electrode; and
  a second electrode formed on the chalcogenide layer.

3. The semiconductor integrated circuit device of claim 1, wherein the first ESD protecting circuit further comprises a resistor connected between the nth OTS device of the first ESD protecting circuit and the data pad.

4. The semiconductor integrated circuit device of claim 1, wherein the first ESD protecting circuit further comprises an NMOS transistor configured to connect the power voltage line to the ground voltage line in response an output signal of the nth OTS device of the first ESD protecting circuit.

5. The semiconductor integrated circuit device of claim 1, wherein the first to mth OTS devices of the second ESD protecting circuit are sequentially stacked on the semiconductor substrate and the first to mth OTS devices of the second ESD protection circuit are electrically coupled with each other via the contacts, and
  wherein the first OTS switch device of the second ESD protection circuit is electrically coupled to the first ESD protecting circuit and the mth OTS switch device of the second ESD protection circuit is electrically coupled to the ground voltage line.

6. The semiconductor integrated circuit device of claim 5, wherein the second ESD protecting circuit further comprises a resistor connected between the mth OTS device of the second ESD protecting circuit and the ground voltage line.

7. The semiconductor integrated circuit device of claim 5, wherein the second ESD protecting circuit further comprises an NMOS transistor configured to connect the power voltage line to the ground voltage line in response to an output signal of the mth OTS device of the second ESD protecting circuit.

* * * * *